United States Patent
Chhor et al.

(10) Patent No.: US 6,215,689 B1
(45) Date of Patent: Apr. 10, 2001

(54) ARCHITECTURE, CIRCUITRY AND METHOD FOR CONFIGURING VOLATILE AND/OR NON-VOLATILE MEMORY FOR PROGRAMMABLE LOGIC APPLICATIONS

(75) Inventors: Khushrav S. Chhor, Fremont; Bo Soon Chang, Cupertino, both of CA (US); Timothy M. Lacey, Bedford, NH (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/442,851

(22) Filed: Nov. 18, 1999

(51) Int. Cl.$^7$ ............... H01L 21/70; G11C 5/06
(52) U.S. Cl. ............... 365/63; 257/208; 257/678; 257/684; 438/106; 438/128; 438/129
(58) Field of Search .............. 365/63; 257/208, 257/678, 684; 438/106, 128, 129

(56) References Cited

U.S. PATENT DOCUMENTS

| | | | |
|---|---|---|---|
| 5,068,603 | * 11/1991 | Mahoney | 324/158 R |
| 5,124,273 | * 6/1992 | Minami | 437/51 |
| 5,255,203 | * 10/1993 | Agrawal et al. | 364/489 |
| 5,424,589 | * 6/1995 | Dobbelaere et al. | 326/41 |
| 5,594,273 | * 1/1997 | Dasse et al. | 257/620 |

FOREIGN PATENT DOCUMENTS

| | | |
|---|---|---|
| 360053035 | * 3/1985 | (JP) . |
| 403058380 | * 3/1991 | (JP) . |
| 4033878 | * 9/1993 | (JP) . |
| 409102584 | * 4/1997 | (JP) . |

OTHER PUBLICATIONS

Gregus et al., "Chip–Scale Modules for High–Level Integration in the 21st Century," Bell Labs Technical Journal, Jul.–Sep. 1998, pp. 116–124.

* cited by examiner

Primary Examiner—Viet Q. Nguyen
(74) Attorney, Agent, or Firm—Kevin L. Daffer; Conley, Rose & Tayon

(57) ABSTRACT

Architecture, circuitry, and methods are provided for operating a high speed, volatile programmable logic integrated circuit using back-up non-volatile memory cells configured on an integrated circuit separate from the programmable logic integrated circuit. The lower density non-volatile memory cells can be formed on an integrated circuit using fabrication steps similar to those used to form, e.g., EEPROM devices or, more specifically, flash EEPROM devices. The programmable logic integrated circuit includes high density, volatile memory cells integrated with high speed, low density configurable CMOS-based logic. By using two separate processing technologies on two separate and distinct monolithic substrates, and interconnecting the separate integrated circuits on a singular monolithic substrate, the advantages of non-volatility can be combined with a high speed programmable circuit. The pins extending from the programmable logic device can be mounted in various ways to corresponding receptors on a printed circuit board. The present architecture, circuitry, and method thereby presents a packaged device which inherently has the same characteristics as a single integrated circuit, yet is actually two integrated circuits having the benefits of non-volatility as well as the benefits of higher speed, higher density volatile logic blocks within a programmable logic device or complex programmable logic device.

22 Claims, 5 Drawing Sheets

ARCHITECTURE, CIRCUITRY AND METHOD FOR CONFIGURING VOLATILE AND/OR NON-VOLATILE MEMORY FOR PROGRAMMABLE LOGIC APPLICATIONS

BACKGROUND OF THE INVENTION

1. Field of the Invention

This invention relates to a computer subsystem architecture, a programmable logic device, and a method that employs a programmable logic device integrated circuit functioning on a single substrate with a non-volatile memory integrated circuit to produce a high speed, high density volatile memory-based programmable logic device ("PLD") that will appear to the user as being non-volatile.

2. Description of the Related Art

The following descriptions and examples are not admitted to be prior art by virtue of their inclusion within this section.

Programmable arrays or PLDs are commonly used to implement logic networks. PLDs are general-purpose digital components which are manufactured in an non-programmed state, and are later programmed to implement a desired logical function. A PLD is typically programmed by a sequence of electrical pulses which configure one or more arrays of programmable switching elements within the PLD. Examples of different types of PLDs include programmable read-only memories ("PROMs"), field programmable logic arrays ("FPLAs"), programmable array logic devices ("PALs), field programmable gate arrays ("FPGAs"), and complex programmable logic devices ("CPLDs").

The configuration of internal switches are programmed after the particular logic function of the PLD has been prepared and checked using a computer-aided design package appropriate for the PLD family used. As such, the PLD embodies a logic block containing an array of programmable switches. The switches can be permanently set or "programmed," or temporarily set depending on whether the PLD is considered a volatile memory-based PLD or a non-volatile memory-based PLD. For example, fuses, anti-fuses, or floating gates generally known in the EPROM technologies, can be used to establish non-volatile memory cells within the logic block. Conversely, volatile memory cells can be dynamically reset, programmed or maintained only when power exists to the PLD. Typical volatile memory cells include, for example, random access memory ("RAM") or static RAM ("SRAM").

Depending on the desired logic network, the logic block of a PLD can either be an array of volatile or non-volatile memory cells coupled to an AND array or an OR array to produce product terms or sum terms, respectively. The logic block or array architecture can thereby be classified as a product term array, a sum term array, or both. Also, the logic block of a PLD can be arranged as a programmable logic array ("PLA"), a programmable array logic ("PAL"), or a programmable array of gates known as programmable gate array ("PGA").

Resulting from the modem capability including an increasingly larger number of gates, multiple PLDs can be embodied upon a single monolithic substrate. The high-density PLDs may entail numerous interconnected logic blocks, generally described as complex PLDs, or CPLDs. While CPLDs differ somewhat from FPGAs, in that CPLDs have generally fixed, non-segmented routing (i.e., fixed propagation time). For purposes of the present application, CPLDs may include modem FPGAs. Additionally, a CPLD may be considered a highly integrated interconnection of multiple PLDs. The terms PLD, CPLD and FPGA may henceforth be used interchangeably and are deemed to have the same meaning. Moreover, logic blocks set forth in a PLD, CPLD or FPGA herein include product term arrays, sum terms arrays, look-up tables, or a combination of each.

FIG. 1 illustrates in more detail the various circuit elements of a CPLD 10. CPLD 10 includes multiple logic blocks 12 interconnected with a programmable interconnect matrix 14. The number of logic blocks 12 within a complex PLD ranges anywhere from two to beyond sixteen. Each logic block 12 is coupled to other logic blocks and an input/output macro cell 16 via the interconnect matrix 14. Communication to and from the integrated circuit PLD 10 takes place over pins 18 operably coupled to input/output cells 16.

FIG. 2 illustrates further details of an exemplary logic block 12. According to the example shown, logic block 12 can comprise a product term array 20, a product term allocator 22, and macro cells 24. Inputs to product term array 20 can arise from either the programmable interconnect matrix 14 or the input/output cell 16 (shown in FIG. 1). The product term allocator 22 receives the product term from array 20, and allocates or routes that product term to different macro cells 24 depending upon where they are needed. Product term allocator 22 may include an array of volatile or non-volatile memory cells. Macro cells 24 accepts the single output of the product term allocator, wherein the product term allocator 22 ORs the variable number of product terms arising from array 20. Depending on the architecture used, macro cells 24 can be configured as a flip flop, synchronous or asynchronous logic, inverting or non-inverting logic, or any other logic function. The output from macro cells 24 can be fed either to the programmable interconnect matrix or the input/output macro cell. Further details of logic block architecture and, specifically, items 20, 22, and 24 can be obtained in reference to Cypress Semiconductor Corp., part no. CY370 family, or FLASH370™.

FIG. 3 illustrates in further detail product term and sum term arrays 30 and 32, respectively. In particular, product term arrays are generally known as a matrix of input and output conductors programmable at the interconnection therebetween. The output conductors can be fed into an AND array 34 to encompass a product term array 30. Output from the product term array 30 can be fed into a sum term array, or an OR array 32, if desired. The sum term array is classified as such based on the output conductors feeding into OR gates 36.

The product term array 20, shown in FIG. 2, may be implemented as array 30 with AND gate outputs 34 shown in FIG. 3. Product term allocator 22, shown in FIG. 2, however can encompass the sum term array 32, shown in FIG. 3. It is important to note that the array of memory cells need not necessarily be a product array. Instead, the array can be a sum array or a combination of product and sum terms, depending on the desired degree of programmability. Regardless of the form taken, it is generally desired that the array be non-volatile. In order that the PLD not lose its programmed state when power is lost, each cross-point switch is preferably a fuse, anti-fuse, or EEPROM cell. More preferably, the matrix of memory cells can constitute a flash EEPROM. Flash EEPROMs are advantageous if fast erase and high density applications are desired. A flash EEPROM cell is generally a single transistor comprising a control gate dielectrically spaced above a floating gate. The floating gate receives programmed charge and maintains that charge over a relatively long period of time (e.g., approximately 10 years or longer).

Both the flash EEPROM single-transistor cell and the EEPROM cell in general have several disadvantages. First, the gate lengths of a control and/or floating gate are typically much greater than gate lengths of a conventional CMOS transistor. Secondly, the gate dielectric between the floating gate and the channel must be processed relatively thin in a select region in order to form a tunnel oxide necessary for Fowler-Nordheim tunneling. The processing sequence needed to fabricate an EEPROM cell is altogether different from the sequence used in forming a standard CMOS transistor. The non-volatile fabrication process (i.e., EEPROM, flash EPROM, PROM, etc.) typically lags the CMOS process by at least one generation. This results in slower operation speeds using non-volatile processes compared to the CMOS process.

While it is desirable to utilize the non-volatile aspects of EEPROM, it would be desirable not to employ EEPROM on the same monolithic substrate as an integrated circuit having higher density CMOS structures. Removing the EEPROM devices from the substrate having CMOS devices would beneficially reduce the overall size of the PLD and improve performance.

SUMMARY OF THE INVENTION

The problems outlined above are in large part solved by a non-volatile PLD which avoids having to employ non-volatile transistors or cells upon the substrate bearing non-standard CMOS transistors. Beneficially, the non-volatile cells, such as EEPROM-based cells, fuses, or anti-fuses, are placed on a monolithic substrate separate from a substrate on which the PLD is configured. Instead of employing non-volatile cells, the PLD (interchangeably referring to CPLD, FPGA or, more simply as programmable logic integrated circuit with a separate non-volatile memory integrated circuit) utilizes higher speed volatile cells, such as SRAM cells. The PLD and non-volatile memory cells are operably linked on a single, monolithic substrate and packaged having multiple pins extending from that substrate.

The pins connect only to the input/output pads on the programmable logic integrated circuit through various means, including wire-bond, surface mount, or ball-grid connection. The substrate includes multiple conductors extending within and/or upon the substrate, and are used to interconnect input/output pads of the non-volatile memory integrated circuit with input/output pads of the programmable logic integrated circuit. Interconnection between the two integrated circuits occurs solely upon the substrate, whereby the user can access the PLD with the non-volatile memory operation being transparent to the user. Thus, the packaged substrate and pins extending therefrom, are separate from a printed circuit board on which the packaged substrate can be connected. Interconnection between the two integrated circuits thereby does not involve use of printed conductors on the printed circuit board, thusly freeing those printed conductors for other applications necessary to achieve a more highly integrated computer subsystem.

Instead of consuming a large portion of a PLD with non-volatile memory cells, the present programmable logic integrated circuit is relatively small in size since volatile memory cells are used. Moreover, the logic device is faster and takes advantage of the more modem, high density processes used in CMOS fabrication. Access times are substantially greater than if the logic device where to contain non-volatile memory. Instead, code within the stand-alone non-volatile memory integrated circuit is loaded into the volatile memory cells of the logic device when power to the logic device is resumed. Accordingly, even if power is lost, the non-volatile memory integrated circuit maintains the programmed code. When power is regained, the logic device simply fetches code from non-volatile memory across conductors of the substrate and into corresponding volatile memory cells of the logic blocks. Thereafter, the computer subsystem need merely access the higher speed volatile memory without requiring any access to the non-volatile memory integrated circuit.

Broadly speaking, computer subsystem architecture is presented comprising a non-volatile memory integrated circuit and a programmable logic integrated circuit coupled to a monolithic substrate. Furthermore, the monolithic substrate is separate from a printed circuit board, yet can be coupled onto the printed circuit board. The monolithic substrate includes a plurality of pins extending from the outer periphery of the monolithic substrate, wherein the pins are electrically coupled between input/output pads of the programmable logic integrated circuit and respective receptors upon the printed circuit board. One of the pins can be used to receive serially fed data when another pin receives an In-System Programming ("ISP") signal. The serially fed data can be converted to parallel-fed data and presented upon the non-volatile memory integrated circuit. The same pin, or another pin, can be configured to receive serially fed data used for testing the non-volatile memory and/or the programmable logic device when the ISP enable signal is no longer present and, instead, a test enable signal occurs. Accordingly, the pins upon the substrate are connected to allow the PLD and non-volatile memory to be programmed and tested according to the Joint Test Action Group ("JTAG") standard. The JTAG standard is useful in testing assembled printed circuit boards and other components placed on the printed circuit board. It also allows for serially programming volatile and non-volatile memory components while those components are connected to the printed circuit board. Of benefit is that fewer than five pins are used to perform testing and programming of the present two-die, non-volatile PLD.

According to another embodiment, a programmable logic device configured entirely upon a monolithic substrate having pins extending from the monolithic substrate to a printed circuit board. The programmable logic device includes a plurality of volatile memory cells arranged within logic blocks of a programmable logic integrated circuit. A plurality of non-volatile memory cells are configured upon a non-volatile memory integrated circuit separate from the programmable logic integrated circuit. A plurality of conductors extend partially across the monolithic substrate between the programmable logic integrated circuit and the non-volatile memory integrated circuit. The conductors are adapted to transfer information from the non-volatile memory cells to the volatile memory cells when power to the programmable logic integrated circuit has been terminated and thereafter is resumed.

The non-volatile memory can be serial or parallel memory. In instances or serial memory, the programmable logic integrated circuit (PLD) could have inputs and a mode that basically gives direct access to the serial port of the non-volatile memory. In the case of parallel memory, the PLD receives serial data from the JTAG interface and converts it to parallel inputs to the parallel memory. Hence four JTAG pins can achieve the same bandwidth (can perform the same work) as, e.g., 30 pins of a 1 Mbit parallel EPROM.

According to another embodiment, a method is presented. The method is used for configuring volatile memory cells within logic blocks of a programmable logic integrated circuit. The method includes reading data from a non-volatile memory integrated circuit arranged separate from the programmable logic integrated circuit. The read data is then transferred from the non-volatile memory integrated circuit to the programmable logic integrated circuit across conductors of the monolithic substrate on which the programmable logic integrated circuit and the non-volatile memory integrated circuit are coupled. The transferred data is then stored within the volatile memory cells. The non-volatile memory integrated circuit can be programmed by forwarding a first serial data stream across a single conductor extending from the substrate and/or programmable logic integrated circuit. The first serial data stream is then converted into parallel data, and the parallel data is placed upon a plurality of the non-volatile memory cells. The non-volatile memory integrated circuit then can be tested by reading the parallel data placed within the non-volatile memory cells, converting the read parallel data into a second serial data stream, and comparing the second serial data stream with the first serial data stream.

BRIEF DESCRIPTION OF THE DRAWINGS

Other objects and advantages of the invention will become apparent upon reading the following detailed description and upon reference to the accompanying drawings in which.

Figure 1:
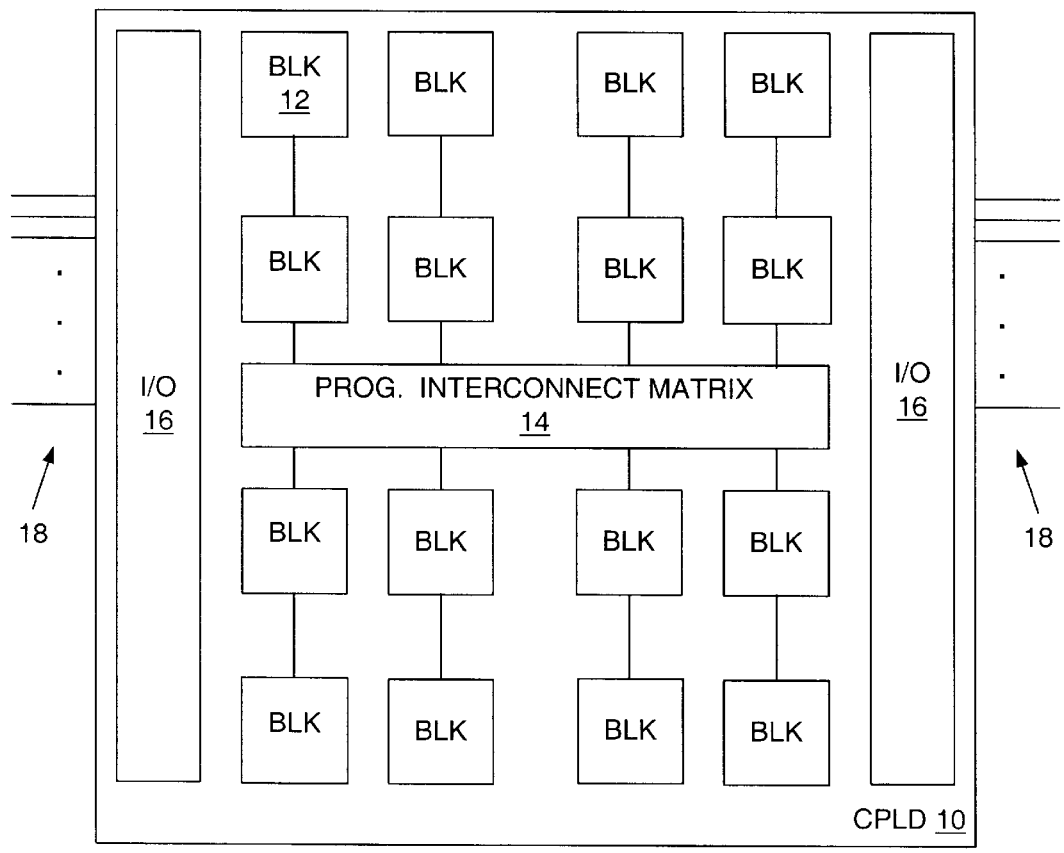
FIG. 1 is a block diagram of a CPLD integrated circuit having non-volatile memory cells within one or more logic blocks.
Figure 2:
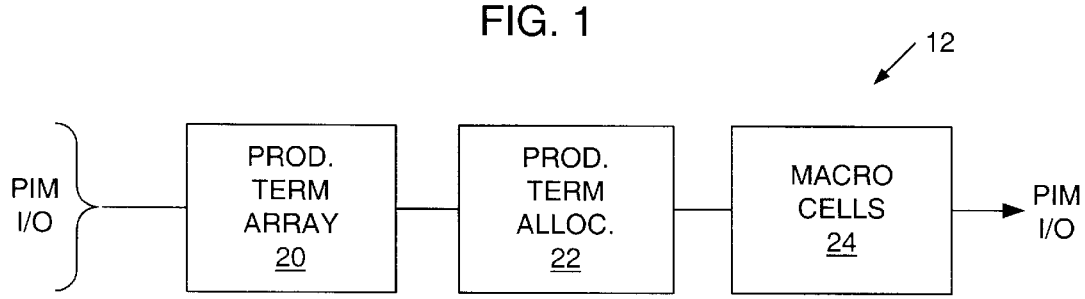
FIG. 2 is a block diagram of an exemplary logic block such as those found in the CPLD of FIG. 1.
Figure 3:
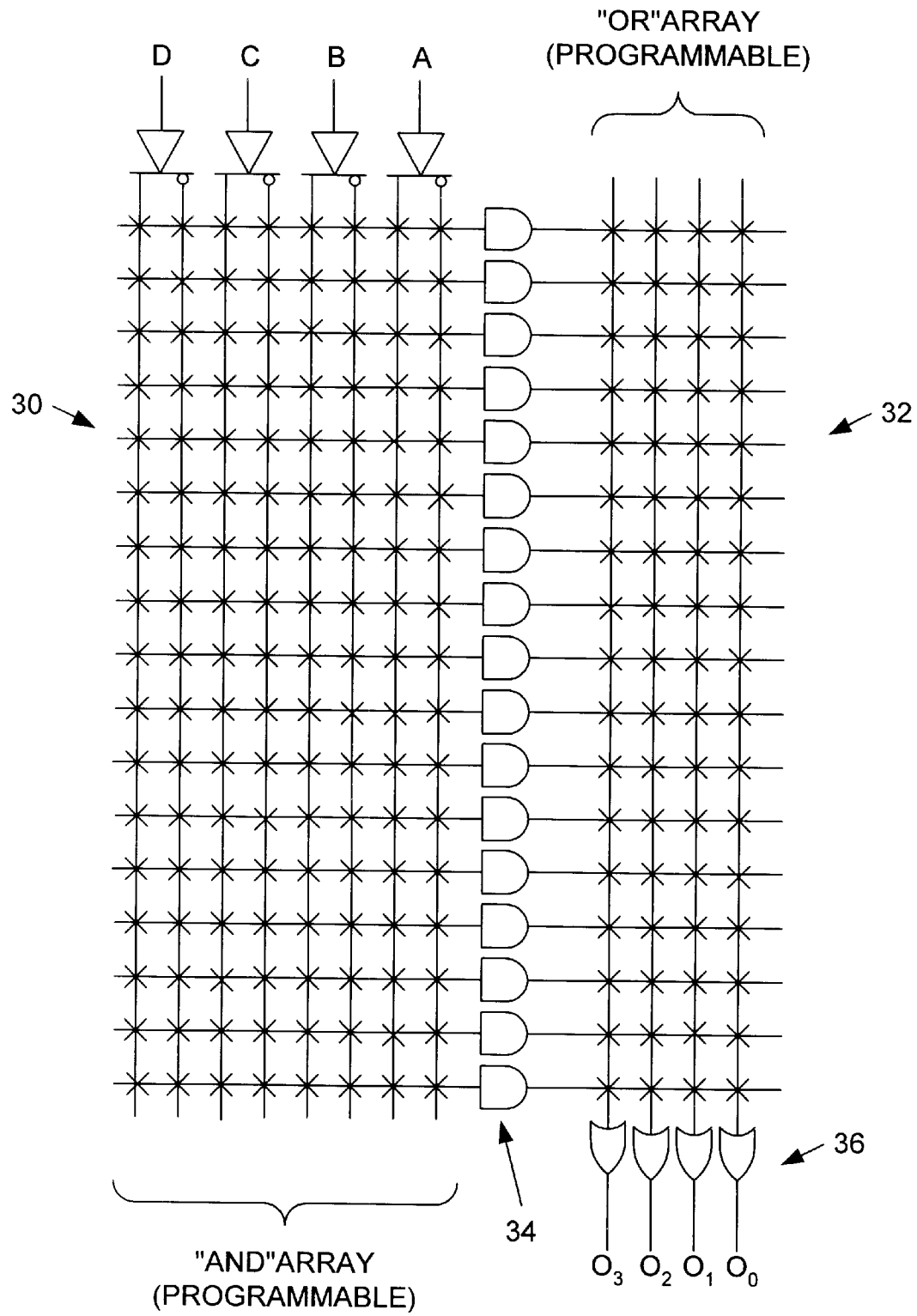
FIG. 3 is a circuit schematic of an array of programmable, volatile memory cells that can be substituted for the non-volatile memory cells within the logic block of FIGS. 1 and 2.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 4:
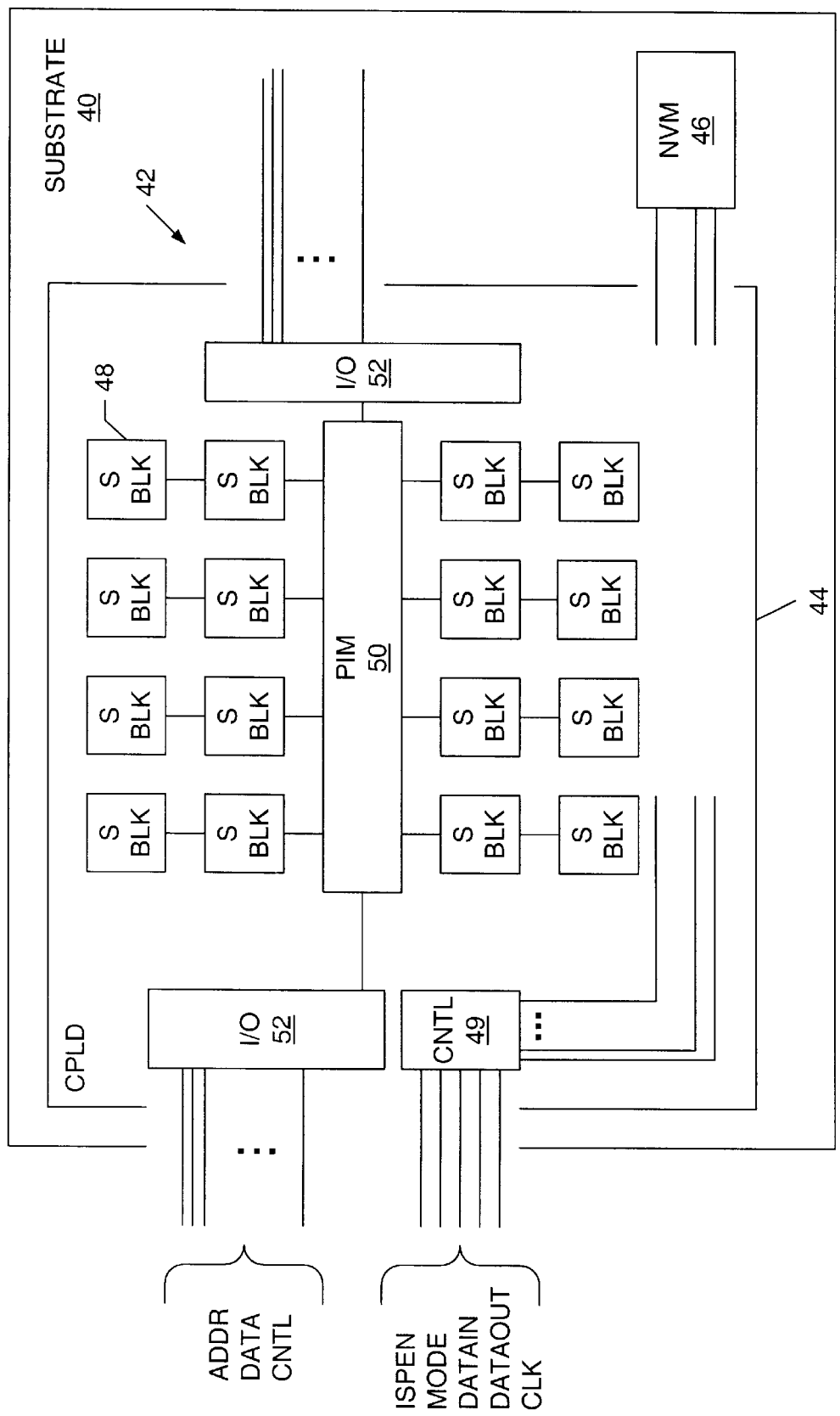
FIG. 4 is a block diagram of the volatile memory cells arranged within logic blocks of a programmable logic integrated circuit, and a separate non-volatile memory integrated circuit coupled to the programmable logic integrated circuit and mounted on the same monolithic substrate on which the programmable logic integrated circuit resides.

Turning to the drawings, FIG. 4 illustrates a programmable logic device 40 comprising two separate integrated circuits coupled upon a single monolithic substrate. The substrate contains conductors 42 which extend between a programmable logic integrated circuit 44 and a non-volatile memory integrated circuit 46. Programmable logic circuit 44 preferably includes multiple logic blocks and, thus, can be considered a complex programmable logic integrated circuit. Each logic block comprises an array of volatile memory cells, preferably SRAM-based memory cells. The logic blocks, denoted as item 48, are coupled to a programmable interconnect matrix 50 and/or an input/output matrix 52. Accordingly, logic circuit 44 is essentially the same as a conventional CPLD or PLD, except that the logic blocks contain volatile memory cells, and the logic circuit 44 is connected to non-volatile memory cells arranged on a common substrate external to the logic circuit.

The programmable logic device 40 contains two separate integrated circuits mounted upon a substrate, where pins extend from an outer periphery of the substrate and are electrically connected to input/output pads of the programmable logic integrated circuit 44 to conductors within the substrate that connect with pads of integrated circuit 44. As such, programmable logic device 40 appears as a single, packaged integrated circuit having all the features of a single integrated circuit. The pins extending from the single package PLD can be arranged in one of numerous ways. For example, the package and pins can be configured as a quad flat pack, a leaded or leadless chip carrier, a ball grid array, pin grid array, or essentially any packaged configuration which can achieve a relatively high density pin configuration.

The input/output pins of a PLD are generally well known, and include pins dedicated for receiving address, data, and control signals. As shown, the input/output matrix 52 can receive an address signal, and data either forwarded to (written data) or data transferred from (read data) the logic circuit 44 or non-volatile memory 46, or both. Only logic circuit 44 is connected to the peripheral pins of device 40. Non-volatile memory 46 is connected only to conductors and/or pads of logic circuit 44. During normal operation, the addressed data and control signals are actuated. However, if the non-volatile memory cells of memory 46 are to be programmed, or one or both integrated circuits 44 and 46 are to be tested, device 40 can be configured in a test or program mode, separate and distinct from its normal operating mode. Beneficially, device 40 can be programmed and tested while connected to a printed circuit board, and the program and test operations can be achieved using a minimal number of input/output pins. In-System Programming or ISP (i.e., programming when electrically linked to the printed circuit board) is beneficial since it allows a user to re-configure the logic arrangement in the field, without removing device 40 from a printed circuit board. Testing can also be achieved while the device is connected to the printed circuit board to not only test the programmed circuitry of device 40, but also the connection and inter-connection of the printed circuit board and other integrated circuits thereon.

Beneficially, ISP and In-System Testing ("IST"), can be achieved using minimal pins while serially feeding the test/program data into a single pin and, when in test mode, reading the test data serially from another single pin. The various functions of test mode ("MODE") signal, input data ("DATAIN") signal, output data ("DATAOUT") signal, and clocking signal ("CLK") signal are generally well known signals and further described in reference to the JTAG standards established in IEEE Standard 1149.1a-1993 (herein incorporated by reference). The general concept of forwarding serialized data, and shifting the serialized data into registers according to a clocking input, and thereafter reading serialized output data is also described in reference to U.S. Pat. No. 4,710,927 (herein incorporated by reference).

FIG. 4 further illustrates the benefits of using volatile logic blocks 48 within logic circuit 44, separate and distinct from non-volatile memory cells within memory 46. A controller 49 is used to receive the ISP test mode signals and forwards those signals to memory 46. The volatile memory cells of logic blocks 48 can be configured using high density, high speed CMOS fabrication techniques so that when device 40 is operating exclusively from integrated circuit 44, access to and from the volatile memory cells is relatively fast and consumes minimal power. Furthermore, the volatile memory cells can be made much smaller in lateral dimension than non-volatile memory cells so as to achieve an overall smaller chip dimension of integrated circuit 44 relative to conventional non-volatile memory cell PLDs.

Operation of logic device 40 occurs when power is applied to the logic device and programmed information is present in the non-volatile memory 46. After power is removed, however, the programmed state of cells within memory 46 even though cells within blocks 48 lose their programmed status. When power is resumed, logic blocks 48 are programmed by downloading data from the non-volatile memory cells. The non-volatile memory cells are thereby accessed only after power is lost and the computer system is powered back up through a boot up sequence. At all other times, communication between the two separate integrated circuits does not exist. Instead, communication occurs solely to and from the programmable logic integrated circuit 44. In this fashion, access times are substantially reduced since accesses occur to the higher speed, high density volatile memory cells found exclusively in the logic circuit 44.

Figure 5:
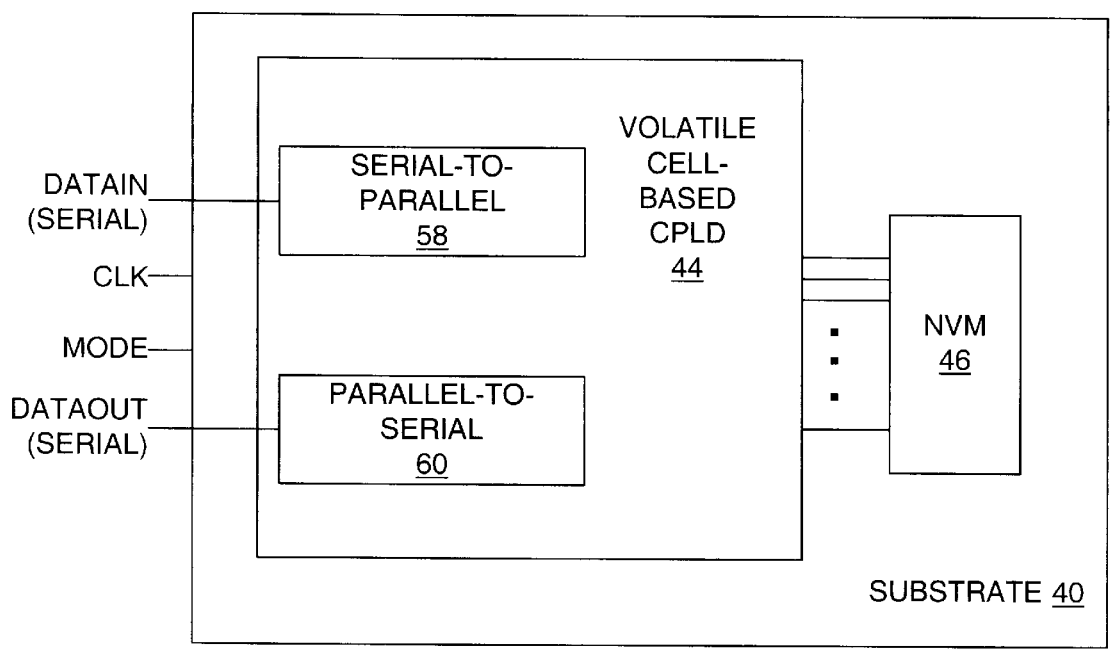
FIG. 5 is a block diagram depicting in-circuit programming and testing of the programmable logic integrated circuit using a single input on the substrate to receive input data and a single output to receive output data.

FIG. 5 illustrates features of device 40 useful in either programming or testing one or both integrated circuits 44 and 46 depending on whether the ISPEN signal indicates an ISP or an IST (given that JTAG port is always active). When in the ISP or IST mode, the serialized input data is either program data or test data, respectively. The serialized data is shifted on transitional edges of the clocking signal into one or more registers 58, for example. The serialized data can then be drawn in parallel fashion from registers 58 and thereafter possibly forwarded into several multiplexers which, upon receiving a select signal, forwards in parallel the input data into non-volatile memory integrated circuit 46. The multiplexers may be controlled by code contained in, for example, a state register, to ensure proper timing of the parallel-fed input data. If the input data represents a program sent by an ISP device, then the program remains within the selected non-volatile memory cells of integrated circuit 46 until those selected cells are reprogrammed. However, if the input data is test data, then it is important to read back the programmed test data from integrated circuit 46. The read data can therefore be addressed and placed into one or more output data registers 60. Registers 60 serially shift the parallel-fed data to the output data terminal of device 40, where that data can be compared against the input data to determine if device 40 passes the diagnostic test.

Figure 6:
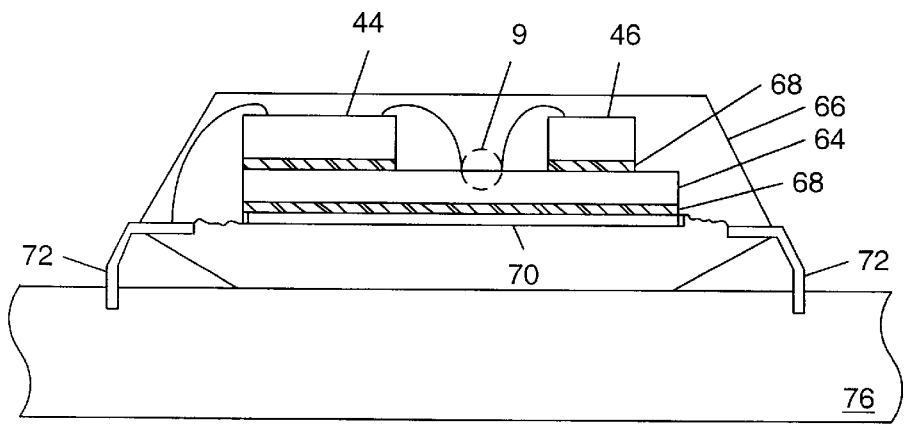
FIGS. 6, 7 and 8 are cross sectional views of the programmable logic integrated circuit and non-volatile memory integrated circuits embodied upon a monolithic substrate, wherein the substrate includes peripheral pins electrically coupled to the programmable logic integrated circuit only, and wherein the pins extend into or onto receptors of a printed circuit board according to three exemplary embodiments.

FIG. 6 illustrates the interconnection of the two separate integrated circuits 44 and 46 using conductors embedded within and conductors extending upon a single monolithic substrate 64. As shown, input/output pads of the various integrated circuits can be wire-bonded to pads or "fingers" arranged on an upper surface of substrate 64. The fingers are then either routed to a via or to another finger which receives a wire-bond from, for example, the other integrated circuit. If routed to a via, the via extends downward to an embedded conductor within substrate 64. The embedded conductor serves to route signals from one via to another via, and then back up to the surface, where a wire-bond can be attached.

The combination of integrated circuits 44 and 46, as well as possibly other integrated circuits bonded to substrate 64 can be encapsulated within an integrated circuit package 66. Package 66 hermetically seals all that which is contained within package 66 against ingress of air and moisture. According to the embodiment shown, an adhesive 68 may be used to connect the back-side surface of the various integrated circuits to an upper surface of substrate 64. Adhesive 68 may also be used to connect the back-side surface of substrate 64 to a lead frame 70. Lead frame 70 is contained upon a plane commensurate with leads 72 extending from an outer periphery of package 66. Leads 72 are arranged so as to extend in mating alignment with receptors of a printed circuit board 76. The receptors shown can be through-hole eyelets connected to buried or surface-configured conductors upon or within board 76. Both leads 72 and the receptors receive solder to ensure proper electrical connection therebetween.

It is noted that the printed circuit board includes all the various types of boards generally known in the industry, such as daughterboards or motherboards, and are separate and distinct from the packaged device 66. Device 66 appears as a single integrated circuit. However, in essence, device 66 contains two integrated circuits interconnected on a single substrate 64. FIG. 6 illustrates a wire-bonding example. However, it is to be noted that various other examples and exemplary embodiments are contemplated. Examples of those embodiments are set forth in FIGS. 7 and 8.

Figure 7:
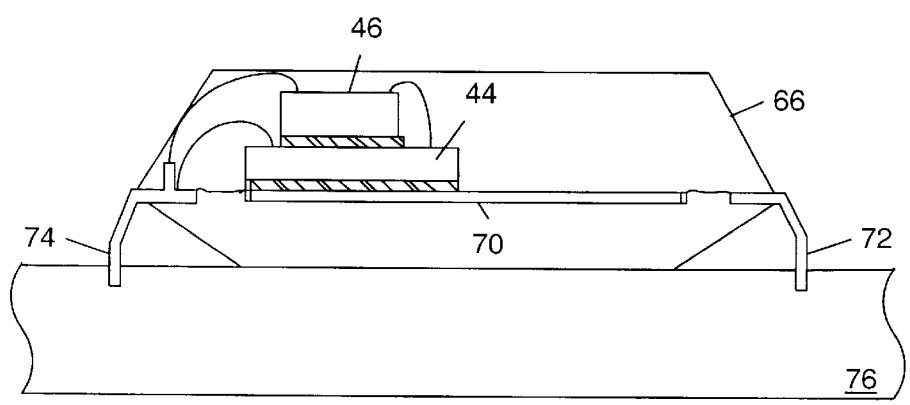

FIG. 7 illustrates an alternative bonding scheme, whereby the non-volatile memory integrated circuit 46 is mounted upon a surface of programmable logic integrated circuit 44. The mounting mechanism can be either a ball grid array or, as shown, an adhesive utilizing a back-side surface of integrated circuit 46 and a front-side surface of integrated circuit 44. If a ball grid array is used, then the front-side surface can be reversed and connected to a front-side surface of integrated circuit 44 similar to a flip-chip arrangement, for example. If adhesive is used, then electrical connection is made using wire-bonded leads from an upper surface of integrated circuit 46 to an upper surface of integrated circuit 44. Again, integrated circuit 44 can be adhesive bonded to lead frame 70. Wire leads can extend to a multi-receptor lead 72 to effectuate interconnection between the two separate integrated circuits, if desired. The multi-receptor lead is shown as reference numeral 74, in the example provided. The combination of integrated circuits interconnected with one another, lead frame 70, and the inner portion of leads 72 and 74 can be encapsulated using a package 66 similar to or slightly dissimilar from the package shown in FIG. 6. For example, packaging can involve plastic encapsulant injected within a mold or a ceramic package having a lid.

Figure 8:
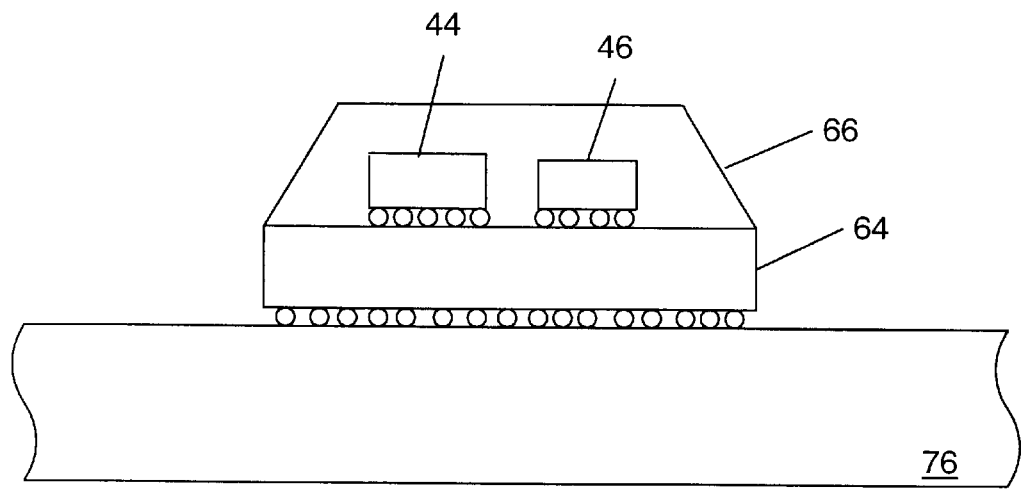

FIG. 8 illustrates yet another bonding configuration, whereby the input/output pads of each integrated circuit 44 and 46 are arranged in an array or, alternatively, are arranged exclusively near the outer periphery of each integrated circuit. The input/output pads can be wave soldered through a flip-chip or C4 arrangement with corresponding pads or fingers on the upper surface of substrate 64. Alternatively, the mating pads can be connected using Surface Mount Technology ("SMT"). If SMT is used, bonding of the various integrated circuits can take place using a Tape Automated Bonding ("TAB") technique.

Similar to the various techniques which can be used to bond integrated circuits 44 and 46 to substrate 64, substrate 64 can be bonded to printed circuit board 76. Those techniques include a C4 flip-chip arrangement, SMT, or wire-bonding, depending on space and time constraints used in effectuating that connection. As shown in FIG. 8, the entire combination of integrated circuits and interconnection therebetween can be encapsulated within package 66 having leads extending therefrom, and connected with receptors upon printed circuit board 76.

Figure 9:
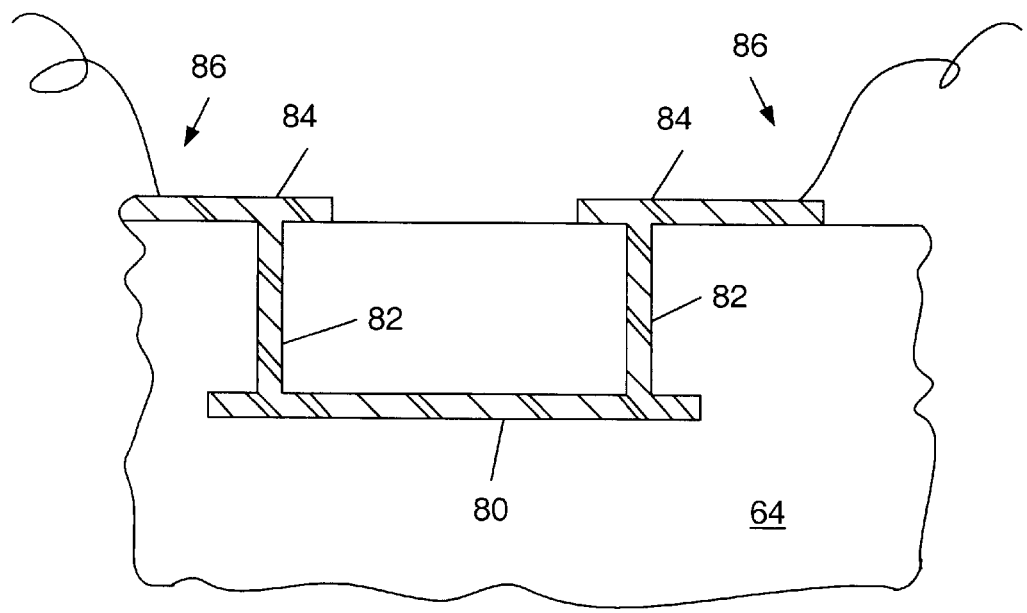
FIG. 9 is a detail cross sectional view of area 9 in FIG. 6, showing interconnection between the non-volatile memory integrated circuit and the programmable logic integrated circuit.

FIG. 9 illustrates in further detail the cross-sectional view 9 of FIG. 6. Regardless of how input/output pads are connected to receptors on substrate 64, it is noted that buried conductors 80 may extend between vias 82. The vias 82 are electrically connected to fingers 86 and surface trace conductors 84. The trace conductors 84 interconnect vias 82 with fingers 86. Each finger is dimensioned to be of sufficient size which will allow an integrated circuit pin, solder ball, SMT pad, etc., to be mounted thereto.

It will be appreciated to those skilled in the art having the benefit of this disclosure that the embodiments described are believed applicable to effectuate the interconnection of a computer subsystem which uses a programmable logic device. The programmable logic device maintains its programmed status even after power is removed to that device by virtue of a non-volatile memory integrated circuit configured separate from a programmable logic integrated circuit bearing volatile, high-speed logic blocks. Accordingly, the specification and drawings are to be regarded in an illustrative rather than a restrictive sense as to possibly numerous logic device variations and architectures which fall within the spirit and scope of the present invention.

What is claimed is:

1. A computer subsystem architecture, comprising:
    a monolithic substrate;
    a non-volatile memory circuit and a programmable logic circuit, both of which are coupled upon the monolithic substrate wherein the monolithic substrate comprises conductors extending between the non-volatile memory circuit and the programmable logic circuit; and
    wherein the monolithic substrate is adapted for coupling onto a printed circuit board.

2. The architecture as recited in claim 1, wherein the conductors extend at least partially within the monolithic substrate.

3. The architecture as recited in claim 1, wherein the monolithic substrate comprises pins extending from an outer periphery of the monolithic substrate.

4. The architecture as recited in claim 3, wherein the pins are electrically coupled to input/output pads of the programmable logic circuit and not to input/output pads of the non-volatile memory circuit.

5. The architecture as recited in claim 3, wherein the pins are configured to electrically connect with receptors arranged upon the printed circuit board.

6. The architecture as recited in claim 1, wherein the programmable logic circuit comprises a single input/output port that is adapted to receive serially fed data to either test or program the non-volatile memory circuit and/or the programmable logic circuit.

7. The architecture as recited in claim 1, further comprising a port embodied partially upon the monolithic substrate electrically coupled between the non-volatile memory circuit and the programmable logic circuit.

8. The architecture as recited in claim 1, further comprising one or more serial test ports extending from the monolithic substrate for testing the non-volatile memory circuit, the programmable logic circuit, or both.

9. A programmable logic device embodied entirely upon a single monolithic substrate having pins extending from the monolithic substrate to a printed circuit board, the programmable logic device comprising:
    a plurality of volatile memory cells arranged within logic blocks of a programmable logic integrated circuit;
    a plurality of non-volatile memory cells configured upon a non-volatile memory integrated circuit; and
    a plurality of conductors extending partially across the monolithic substrate between the programmable logic integrated circuit and the non-volatile memory integrated circuit, wherein said conductors are adapted to transfer data from the non-volatile memory cells to the volatile memory cells when power to the programmable logic integrated circuit is resumed.

10. The programmable logic device as recited in claim 9, wherein the plurality of volatile memory cells comprise static random access memory (SRAM).

11. The programmable logic device as recited in claim 9, wherein the single monolithic substrate is separate and distinct from the printed circuit board on which the single monolithic substrate resides.

12. The programmable logic device as recited in claim 9, wherein said non-volatile memory integrated circuit comprises an electrically eraseable programmable read only memory (EEPROM).

13. The programmable logic device as recited in claim 12, wherein said EEPROM consists essentially of flash EEPROM.

14. The programmable logic device as recited in claim 9, wherein the flash EEPROM is programmed or tested by converting serial data forwarded to the programmable logic device into parallel data forwarded to the non-volatile memory integrated circuit.

15. The programmable logic device as recited in claim 9, wherein said volatile memory cells are programmed to form combinatorial and/or sequential logic within each of said logic blocks by data forwarded from the non-volatile memory cells.

16. The programmable logic device as recited in claim 9, wherein said volatile memory cells are programmed as a product term array, a sum term array, or both.

17. A method for configuring volatile memory cells within logic blocks of a programmable logic integrated circuit, comprising:
    reading data from a non-volatile memory integrated circuit arranged separate from the programmable logic integrated circuit;
    transferring the read data from the non-volatile memory integrate circuit to the programmable logic integrated circuit across conductors of a monolithic substrate on which programmable logic integrated circuit and the non-volatile memory integrated circuit are coupled exclusive of a printed circuit board; and storing the transferred data within the volatile memory cells.

18. The method as recited in claim 17, further comprising, prior to said reading, terminating power to the programmable logic integrated circuit and thereafter resuming power to the programmable logic integrated circuit.

19. The method as recited in claim 17, wherein said storing comprises writing the transferred data into the volatile memory cells arranged as an array of product logic connections, sum logic connections, or both.

20. The method as recited in claim 17, wherein said transferring comprises forwarding the read data exclusively across said conductors which do not extend or connect beyond the substrate.

21. The method as recited in claim 17, further comprising programming the non-volatile memory integrated circuit by:

forwarding a first serial data stream across a single conductor extending from the substrate and electrically coupled to the programmable logic integrated circuit;

converting the first serial data stream into parallel data; and placing the parallel data upon a plurality of said non-volatile memory cells.

22. The method as recited in claim 21, further comprising testing the non-volatile memory integrated circuit by:

reading the parallel data placed within the non-volatile memory cells;

converting the read parallel data into a second serial data stream; and comparing the second serial data stream with the first serial data stream.

* * * * *